(12) United States Patent
Sai

(10) Patent No.: US 11,950,360 B2
(45) Date of Patent: Apr. 2, 2024

(54) METHOD FOR MANUFACTURING CERAMIC SUBSTRATE AND CERAMIC SUBSTRATE

(71) Applicant: Murata Manufacturing Co., Ltd., Nagaokakyo (JP)

(72) Inventor: Koki Sai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 76 days.

(21) Appl. No.: 17/391,770

(22) Filed: Aug. 2, 2021

(65) Prior Publication Data

US 2021/0360777 A1 Nov. 18, 2021

Related U.S. Application Data

(63) Continuation of application No. PCT/JP2020/008258, filed on Feb. 28, 2020.

(30) Foreign Application Priority Data

Mar. 29, 2019 (JP) .................................. 2019-068269

(51) Int. Cl.
*H05K 1/03* (2006.01)
*H05K 1/02* (2006.01)
(Continued)

(52) U.S. Cl.
CPC ......... *H05K 1/0271* (2013.01); *H05K 1/0306* (2013.01); *H05K 3/0014* (2013.01);
(Continued)

(58) Field of Classification Search
CPC .. H05K 1/0271; H05K 1/0306; H05K 3/0014; H05K 3/0052; H05K 3/4629; H05K 2203/1126; H01L 23/08; H01L 23/12
See application file for complete search history.

(56) References Cited

U.S. PATENT DOCUMENTS

2008/0142147 A1   6/2008   Kawamura et al.
2008/0308976 A1   12/2008  Ito et al.
(Continued)

FOREIGN PATENT DOCUMENTS

| JP | H03245556 A | 11/1991 |
|----|----|----|
| JP | 2002151855 A | 5/2002 |

(Continued)

OTHER PUBLICATIONS

International Search Report issued for PCT/JP2020/008258 dated Apr. 7, 2020.

(Continued)

*Primary Examiner* — Steven T Sawyer
(74) *Attorney, Agent, or Firm* — ArentFox Schiff LLP

(57) ABSTRACT

A method for manufacturing a ceramic substrate that includes forming a mother multilayer body by laminating a ceramic green sheet on a shrinkage suppressing green sheet, the shrinkage suppressing green sheet having a planar shrinkage rate in firing smaller than a planar shrinkage rate in firing of the ceramic green sheet; and forming a recessed portion in the mother multilayer body before firing by pressing a recessed portion formation planned region where the recessed portion is to be formed after firing of the mother multilayer body.

9 Claims, 6 Drawing Sheets

(51) Int. Cl.
  *H05K 3/00* (2006.01)
  *H05K 3/46* (2006.01)
(52) U.S. Cl.
  CPC ......... *H05K 3/0052* (2013.01); *H05K 3/4629* (2013.01); *H05K 2203/1126* (2013.01)

(56) References Cited

U.S. PATENT DOCUMENTS

| | | | |
|---|---|---|---|
| 2009/0110893 A1* | 4/2009 | Cho | H05K 3/4629 428/218 |
| 2009/0117357 A1* | 5/2009 | Cho | H05K 3/4611 428/323 |
| 2009/0148710 A1 | 6/2009 | Cho et al. | |
| 2010/0277872 A1* | 11/2010 | Ito | H01L 23/3737 156/60 |
| 2012/0085481 A1 | 4/2012 | Abe et al. | |
| 2013/0307124 A1 | 11/2013 | Wada | |
| 2016/0286658 A1 | 9/2016 | Matsubara | |
| 2019/0043770 A1 | 2/2019 | Kisaki et al. | |

FOREIGN PATENT DOCUMENTS

| | | | |
|---|---|---|---|
| JP | 2005072210 A | 3/2005 |
| JP | 2006185989 A | 7/2006 |
| JP | 2007042893 A | 2/2007 |
| JP | 2009141368 A | 6/2009 |
| JP | 2010205844 A | 9/2010 |
| JP | 2012084642 A | 4/2012 |
| JP | 2013243221 A | 12/2013 |
| JP | 2015170756 A | 9/2015 |
| JP | 2019046966 A | 3/2019 |
| WO | 2006114974 A1 | 11/2006 |
| WO | 2008018227 A1 | 2/2008 |
| WO | 2015129340 A1 | 9/2015 |
| WO | 2017126596 A1 | 7/2017 |

OTHER PUBLICATIONS

International Search Report issued for PCT/JP2020/008257 dated Apr. 7, 2020.
International Search Report issued for PCT/JP2020/008256 dated May 19, 2020.
Written Opinion of the International Search Authority issued for PCT/JP2020/008257, dated Apr. 7, 2020.
Written Opinion of the International Search Authority issued for PCT/JP2020/008258, dated Apr. 7, 2020.
Written Opinion of the International Search Authority issued for PCT/JP2020/008256, dated May 19, 2020.

* cited by examiner

METHOD FOR MANUFACTURING CERAMIC SUBSTRATE AND CERAMIC SUBSTRATE

CROSS REFERENCE TO RELATED APPLICATIONS

The present application is a continuation of International application No. PCT/JP2020/008258, filed Feb. 28, 2020, which claims priority to Japanese Patent Application No. 2019-068269, filed Mar. 29, 2019, the entire contents of each of which are incorporated herein by reference.

FIELD OF THE INVENTION

The present invention relates to a method for manufacturing a ceramic substrate and a ceramic substrate.

BACKGROUND OF THE INVENTION

A ceramic substrate is used as a mounting substrate on which an electronic component is mounted, or a package that houses an electronic component. As for the ceramic substrate (electronic component housing package) described in Patent Document 1, an upper surface of a ceramic green sheet is pressed to create a recessed portion such that the recessed portion is formed on the ceramic substrate after firing.

Patent Document 1: Japanese Unexamined Patent Application Publication No. 2015-170756

SUMMARY OF THE INVENTION

In Patent Document 1, in the press process, pressure applied to the ceramic green sheet differs between a region in which the recessed portion of the ceramic green sheet is formed and a region in which the recessed portion is not formed. Accordingly, in the ceramic green sheet where the recessed portion is processed, there is a density distribution along the plane between the region having the recessed portion and the region not having the recessed portion. For this reason, warpage may occur in the ceramic substrate after firing.

An object of the present invention is to provide a method for manufacturing a ceramic substrate capable of suitably suppressing warpage and a ceramic substrate.

A method for manufacturing a ceramic substrate according to an aspect of the present invention includes forming a mother multilayer body by laminating a ceramic green sheet on a shrinkage suppressing green sheet, the shrinkage suppressing green sheet having a planar shrinkage rate in firing smaller than a planar shrinkage rate in firing of the ceramic green sheet; and forming a recessed portion in the mother multilayer body before firing by pressing a recessed portion formation planned region where the recessed portion is to be formed after firing of the mother multilayer body.

A ceramic substrate according to an aspect of the present invention is a ceramic substrate that includes a substrate comprising a ceramic layer laminated on a shrinkage suppressing layer, the substrate having a bottom portion having a mounting surface, and the shrinkage suppressing layer having a smaller planar shrinkage rate in firing than a planar shrinkage rate in firing of the ceramic layer; and a wall portion on the bottom portion of the substrate and surrounding the mounting surface, wherein the wall portion includes at least the ceramic layer, and an orientation of a grain boundary indicating an interlayer between the ceramic layer and the shrinkage suppressing layer is curved along the mounting surface and an inner wall of the wall portion.

A ceramic substrate according to an aspect of the present invention is a ceramic substrate that includes a substrate comprising a ceramic layer laminated on a shrinkage suppressing layer, the substrate having a bottom portion with a mounting surface, and the shrinkage suppressing layer has a higher content rate of a plate-shaped ceramic filling member than a content rate of the plate-shaped ceramic filling member in the ceramic layer; and a wall portion on the bottom portion of the substrate and surrounding the mounting surface, wherein the wall portion includes at least the ceramic layer, and an orientation of a grain boundary indicating an interlayer between the ceramic layer and the shrinkage suppressing layer is curved along the mounting surface and an inner wall of the wall portion.

According to the present invention, it is possible to appropriately suppress warpage.

DETAILED DESCRIPTION OF THE PREFERRED EMBODIMENTS

Hereinafter, embodiments of a method for manufacturing a ceramic substrate and a ceramic substrate according to the present invention will be described in detail with reference to the accompanying drawings. It should be noted that the present invention is not limited to the embodiments. It will be apparent that the embodiments are illustrative only, and that partial substitutions or combinations of the configurations described in different embodiments may be possible. In the second embodiment and the subsequent embodiments, description of matters common to the first embodiment will be omitted, and only different points will be described. In particular, similar actions and effects according to a similar configuration will not be sequentially described for each embodiment.

First Embodiment

Figure 1:
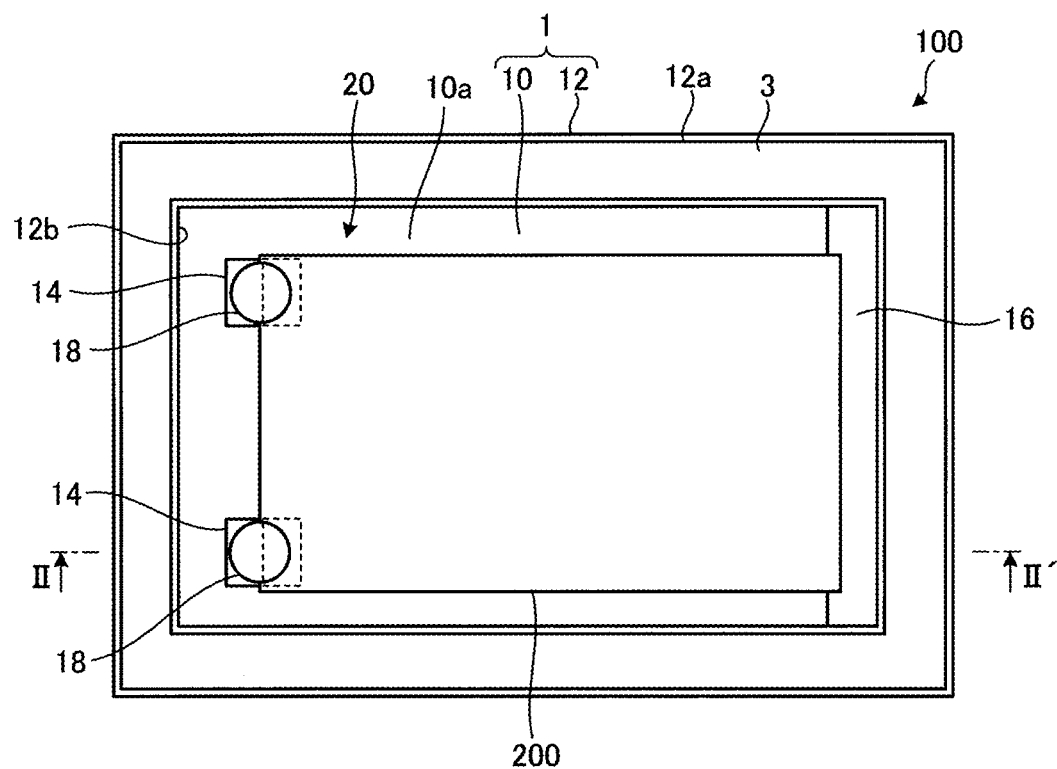
FIG. 1 is a plan view illustrating a configuration of a package including a ceramic substrate according to a first embodiment.
Figure 2:
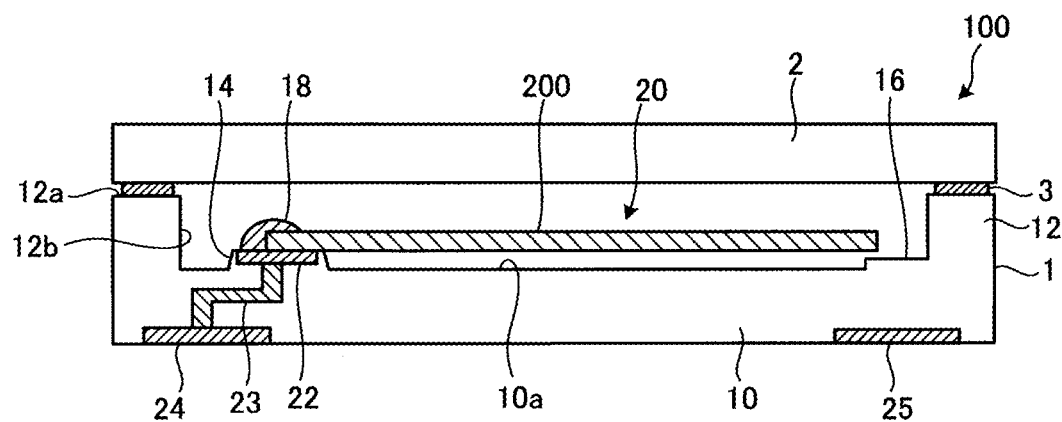
FIG. 2 is a cross-sectional view taken along the line II-II' in FIG. 1.

FIG. 1 is a plan view illustrating a configuration of a package including a ceramic substrate according to a first embodiment. FIG. 2 is a cross-sectional view taken along the line II-II' in FIG. 1. Note that FIG. 1 is a plan view of a ceramic substrate 1 with a lid 2 of a package 100 removed.

As illustrated in FIG. 1, the package 100 includes the ceramic substrate 1. The ceramic substrate 1 has a substrate bottom portion 10 and a wall portion 12. The wall portion 12 surrounds a mounting surface 10a of the substrate bottom portion 10 and is provided in a frame shape. In other words, the ceramic substrate 1 has a recessed portion 20 provided on an upper surface thereof. The ceramic substrate 1 has a rectangular shape in a plan view. Note that in the following description, a plan view indicates an arrangement relationship viewed from a direction perpendicular to the mounting surface 10a.

An electronic component 200 is housed in the recessed portion 20 of the ceramic substrate 1. Specifically, the electronic component 200 is a crystal unit. Pedestals 14 for mounting the electronic component 200 are provided on the mounting surface 10a of the substrate bottom portion 10. The pedestals 14 are provided near corner portions of the mounting surface 10a, and are disposed so as to be separated from the wall portion 12. Further, a supporting portion 16 is provided on the mounting surface 10a of the substrate bottom portion 10. The supporting portion 16 is disposed on a side opposite to the pedestals 14. One end side of the electronic component 200 is joined on the pedestals 14 by using joining members 18. The other end side of the electronic component 200 is positioned on an upper side of the supporting portion 16. The electronic component 200 is separately disposed from the mounting surface 10a, the supporting portion 16, and an inner wall surface 12b of the wall portion 12.

As illustrated in FIG. 2, a connection electrode 22 electrically connected to the electronic component 200 is provided on an upper surface of the pedestal 14. Further, bottom electrodes 24 and 25 are provided on a lower surface of the ceramic substrate 1. The connection electrode 22 and the bottom electrode 24 are electrically connected to each other with a via 23 being interposed therebetween and being provided in the substrate bottom portion 10.

A metallized layer 3 is provided on an upper surface 12a of the wall portion 12. The lid 2 is joined to the ceramic substrate 1 with the metallized layer 3 interposed therebetween. Thereby, a space surrounded by the substrate bottom portion 10, the wall portion 12, and the lid 2 is hermetically sealed.

Figure 3:
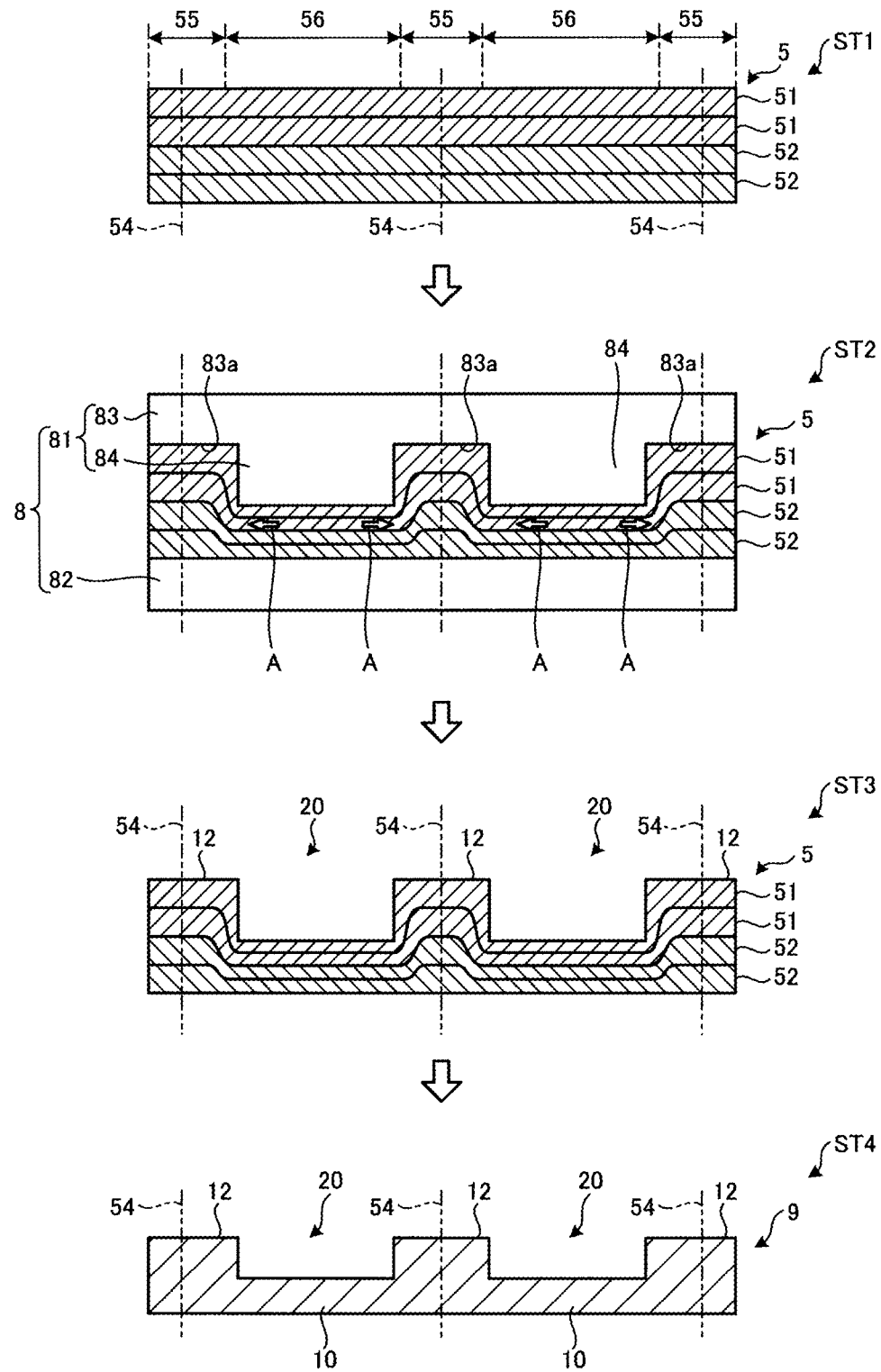
FIG. 3 is an explanatory diagram for describing a method for manufacturing a ceramic substrate.

Next, a method for manufacturing the ceramic substrate 1 will be described. FIG. 3 is an explanatory diagram for describing a method for manufacturing a ceramic substrate. As illustrated in FIG. 3, the method for manufacturing the ceramic substrate 1 includes preparing a plurality of ceramic green sheets 51 and a plurality of shrinkage suppressing green sheets 52, and forming a mother multilayer body 5 by laminating the plurality of ceramic green sheets 51 on the plurality of shrinkage suppressing green sheets 52 (step ST1). Note that although not illustrated in FIG. 3, each of the plurality of ceramic green sheets 51 is formed with various electrodes, such as the via 23, the connection electrode 22, and the bottom electrodes 24 and 25.

The ceramic green sheet 51 contains ceramic powder containing aluminum oxide ($Al_2O_3$) as a main component, and a resin material such as an organic binder and thermoplastic resin. The ceramic green sheet 51 is coated and formed by using, for example, a doctor blade, a lip coater, or the like.

Figure 4:
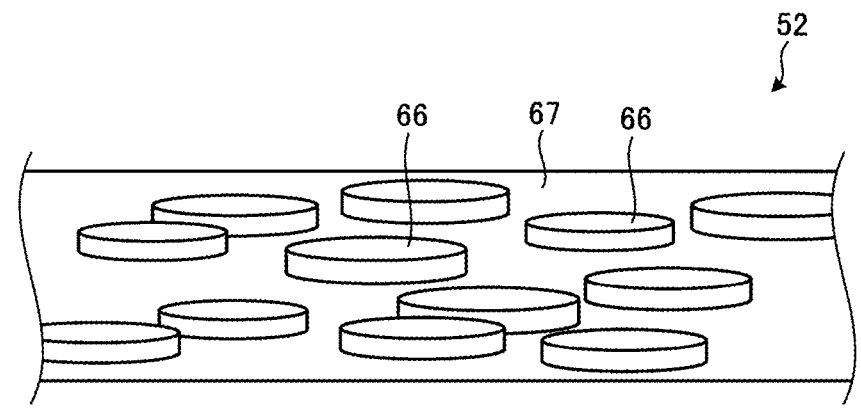
FIG. 4 is a cross-sectional view schematically illustrating a configuration of a shrinkage suppressing green sheet.

The shrinkage suppressing green sheet 52 has characteristics that its own firing shrinkage rate in a direction parallel to a main surface in a plan view, that is, a planar shrinkage rate, is smaller than 1%, when dimensions before and after the firing are compared. The shrinkage suppressing green sheet 52 has a smaller planar shrinkage rate than that of the ceramic green sheet 51. FIG. 4 is a cross-sectional view schematically illustrating a configuration of the shrinkage suppressing green sheet. As illustrated in FIG. 4, the shrinkage suppressing green sheet 52 includes plate-shaped ceramic filling members 66 each of which has a shape close to a plate shape, compared to a shape of the ceramic powder that is a main component as a filler, and a resin material 67 such as an organic binder and thermoplastic resin. The plate-shaped ceramic filling member 66 is, for example, plate-shaped alumina. Note that a maximum length dimension of the plate-shaped ceramic filling member 66 is preferably equal to or more than twice a maximum length dimension of the ceramic powder that is a main component, and is more preferably equal to or more than three times the maximum length dimension of the ceramic powder.

The shrinkage suppressing green sheet 52 is coated and formed by using, for example, a doctor blade, a lip coater, or the like. Accordingly, orientations of the plurality of plate-shaped ceramic filling members 66 are aligned with an in-plane direction of the shrinkage suppressing green sheet 52. As a result, the shrinkage suppressing green sheet 52 can have a smaller planar shrinkage rate than that of the ceramic green sheet 51. Note that the shrinkage suppressing green sheet 52 may have spherical alumina. The plurality of ceramic green sheets 51 and the plurality of shrinkage suppressing green sheets 52 may have different blending ratios of the plate-shaped ceramic filling member 66 and the spherical alumina for each layer.

Figure 5:
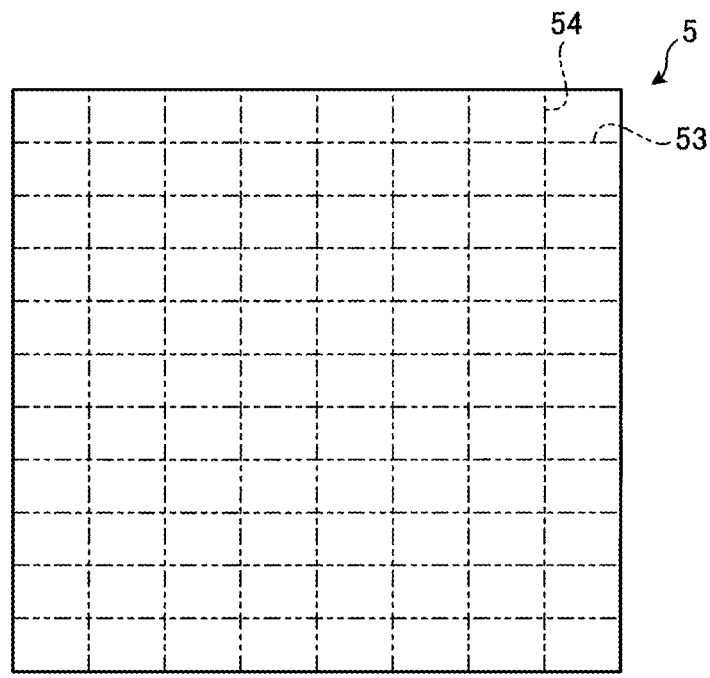
FIG. 5 is a plan view illustrating a mother multilayer body.

FIG. 5 is a plan view illustrating the mother multilayer body. As illustrated in FIG. 5, in the mother multilayer body 5, division planned lines 53 and 54 are provided in a matrix shape. The division planned lines 53 and 54 are virtual lines where the mother multilayer body 5 is to be divided into individual ceramic substrates 1 after firing. That is, a region surrounded by the division planned lines 53 and 54 corresponds to one ceramic substrate 1. In the mother multilayer body 5, grooves for division may be formed at positions overlapping with the division planned lines 53 and 54. For example, a roller breaker may be used as equipment for division into individual ceramic substrates 1, and a dicer may be used as the equipment.

As illustrated in FIG. 3, the mother multilayer body 5 has wall portion formation planned regions 55 and recessed portion formation planned regions 56. The wall portion formation planned region 55 is a region where the wall portion 12 of the ceramic substrate 1 is to be formed after firing and division of the mother multilayer body 5. The recessed portion formation planned region 56 is a region in which the recessed portion 20 of the ceramic substrate 1 is to be formed after the firing and division of the mother multilayer body 5. The plurality of ceramic green sheets 51 and the plurality of shrinkage suppressing green sheets 52 are continuously provided across the wall portion formation planned regions 55 and the recessed portion formation planned regions 56.

Next, as illustrated in FIG. 3, a pressing jig 8 forms the recessed portions 20 in the mother multilayer body 5 by pressing the recessed portion formation planned regions 56 of the mother multilayer body 5 (step ST2). The pressing jig 8 has an upper mold 81 and a lower mold 82. The mother multilayer body 5 is disposed between the lower mold 82 and the upper mold 81. The upper mold 81 has a base 83 and protruding portions 84.

The upper mold 81 presses the mother multilayer body 5 from an upper surface side of the mother multilayer body 5. As a result, first, the recessed portion formation planned regions 56 of the mother multilayer body 5 are pressed by the protruding portions 84. The plurality of ceramic green sheets 51 and the plurality of shrinkage suppressing green sheets 52 deform along shapes of the protruding portions 84 due to the pressure applied from the protruding portions 84. That is, the plurality of ceramic green sheets 51 and the plurality of shrinkage suppressing green sheets 52 in the recessed portion formation planned region 56 are thinned, are pushed out in the directions indicated by the arrows A, and flow to an wall portion formation planned region 55 side. A thickness of the wall portion formation planned region 55 is larger than that of the recessed portion formation planned region 56.

Further, when the upper mold 81 performs pressing, the mother multilayer body 5 deforms so as to cover lower surfaces and side surfaces of the protruding portions 84, and the wall portion formation planned region 55 is in contact with a lower surface 83a of the base 83. The plurality of ceramic green sheets 51 and the plurality of shrinkage suppressing green sheets 52 are curved along the lower surfaces and the side surfaces of the protruding portions 84, and the lower surface 83a of the base 83. As a result, the shapes of the protruding portions 84 are transferred to the mother multilayer body 5.

Pressure larger than that to the wall portion formation planned region 55 is applied to the recessed portion formation planned region 56. Accordingly, density distribution of the plurality of ceramic green sheets 51 and the plurality of shrinkage suppressing green sheets 52 occurs in the recessed portion formation planned region 56 and the wall portion formation planned region 55.

Next, by removing the pressing jig 8, the mother multilayer body 5 having the recessed portions 20 can be obtained (step ST3). Each of the recessed portion formation planned region 56 and the wall portion formation planned region 55 of the mother multilayer body 5 is formed by laminating the plurality of ceramic green sheets 51 and the plurality of shrinkage suppressing green sheets 52.

Next, the mother multilayer body 5 is fired at a predetermined temperature (step ST4). As a result, the plurality of ceramic green sheets 51 and the plurality of shrinkage suppressing green sheets 52 are sintered together to obtain a fired mother multilayer body 9. The fired mother multilayer body 9 is formed with a plurality of recessed portions 20 on an upper surface thereof. In other words, the fired mother multilayer body 9 is arrayed with a plurality of substrate bottom portions 10 and a plurality of wall portions 12 that become the individual ceramic substrates 1 after the division.

According to the method for manufacturing the ceramic substrate 1 of the present embodiment, in the mother multilayer body 5, the plurality of ceramic green sheets 51 is laminated on the plurality of shrinkage suppressing green sheets 52. For this reason, shrinkage of the plurality of ceramic green sheets 51 in a planar direction during firing is suppressed by the plurality of shrinkage suppressing green sheets 52. As a result, in the mother multilayer body 5, the shrinkage in a thickness direction becomes dominant during the firing.

Accordingly, in the present embodiment, occurrence of warpage of the fired mother multilayer body 9 can be suppressed even when density distribution occurs in the recessed portion formation planned region 56 and the wall portion formation planned region 55 in the mother multilayer body 5 before the firing. As a result, it is possible to suppress the warpage of the ceramic substrate 1 formed by dividing the fired mother multilayer body 9.

Figure 6:
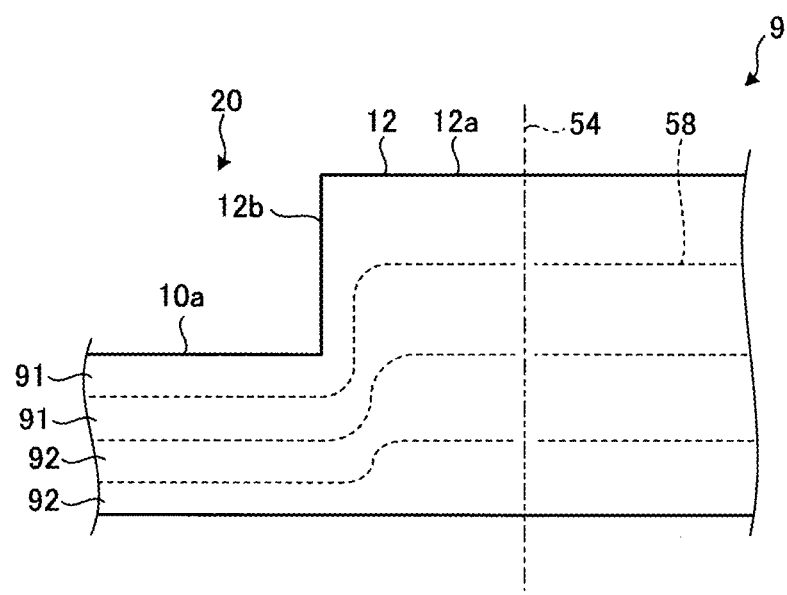
FIG. 6 is a cross-sectional view schematically illustrating the mother multilayer body after firing.

FIG. 6 is a cross-sectional view schematically illustrating the fired mother multilayer body. As illustrated in FIG. 6, the fired mother multilayer body 9 has a plurality of ceramic layers 91 and a plurality of shrinkage suppressing layers 92. The ceramic layers 91 are layers formed by sintering the ceramic green sheets 51. The shrinkage suppressing layers 92 are layers formed by sintering the shrinkage suppressing green sheets 52. That is, the shrinkage suppressing layers 92 have a higher content rate of the plate-shaped ceramic filling member 66 than that of the ceramic layers 91. The substrate bottom portion 10 includes the shrinkage suppressing layers 92 and the ceramic layers 91 provided on the shrinkage suppressing layers 92. The wall portion 12 includes at least one ceramic layer 91.

Orientations of the grain boundaries 58 indicating interlayers between the plurality of ceramic layers 91 and the plurality of shrinkage suppressing layers 92 are curved along the mounting surface 10a, and the inner wall surface 12b and the upper surface 12a of the wall portion 12 due to the flow of the plurality of ceramic green sheets 51 and the plurality of shrinkage suppressing green sheets 52 in the press process.

Second Embodiment

Figure 7:
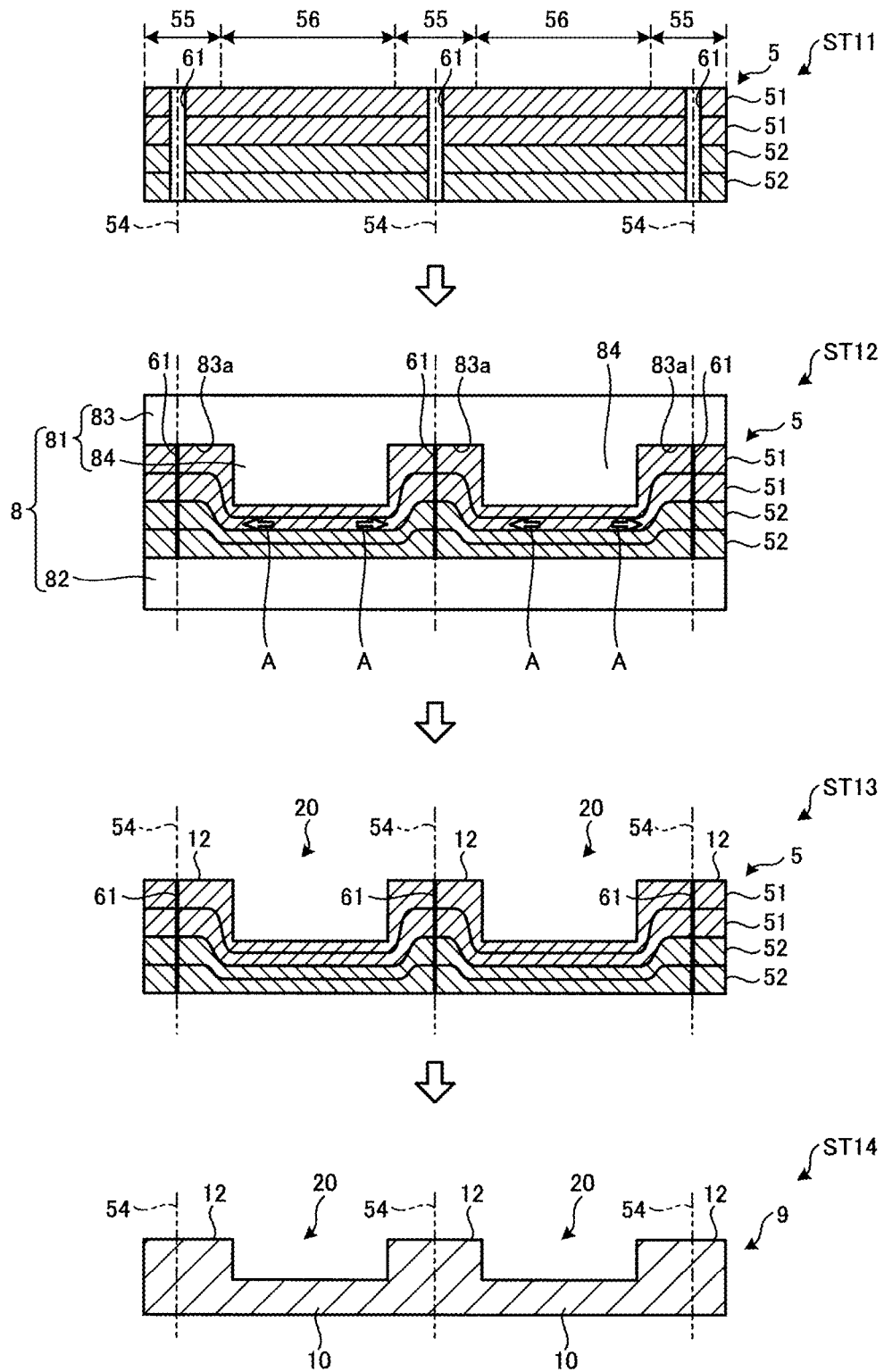
FIG. 7 is an explanatory diagram for describing a method for manufacturing a ceramic substrate according to a second embodiment.

FIG. 7 is an explanatory diagram for describing a method for manufacturing a ceramic substrate according to a second embodiment. In the following description, the same constituent elements as those in the above-described embodiment are denoted by the same reference numerals, and the description thereof will be omitted.

In the second embodiment, unlike the first embodiment described above, a configuration in which hole portions 61 are provided in the mother multilayer body 5 will be described. More specifically, as illustrated in FIG. 7, the method for manufacturing the ceramic substrate 1 includes forming the hole portions 61 in a plurality of ceramic green sheets 51 and a plurality of shrinkage suppressing green sheets 52, and forming the mother multilayer body 5 by laminating the plurality of ceramic green sheets 51 and the plurality of shrinkage suppressing green sheets 52 (step ST11).

The hole portion 61 is formed at a position that does not overlap with the recessed portion formation planned regions 56 of each of the plurality of ceramic green sheets 51 and the plurality of shrinkage suppressing green sheets 52, and that overlaps with the division planned line 54. That is, the plurality of hole portions 61 are provided in the wall portion formation planned region 55 of the mother multilayer body 5. The plurality of hole portions 61 are provided so as to penetrate from the upper surface to the lower surface of the mother multilayer body 5.

Figure 8:
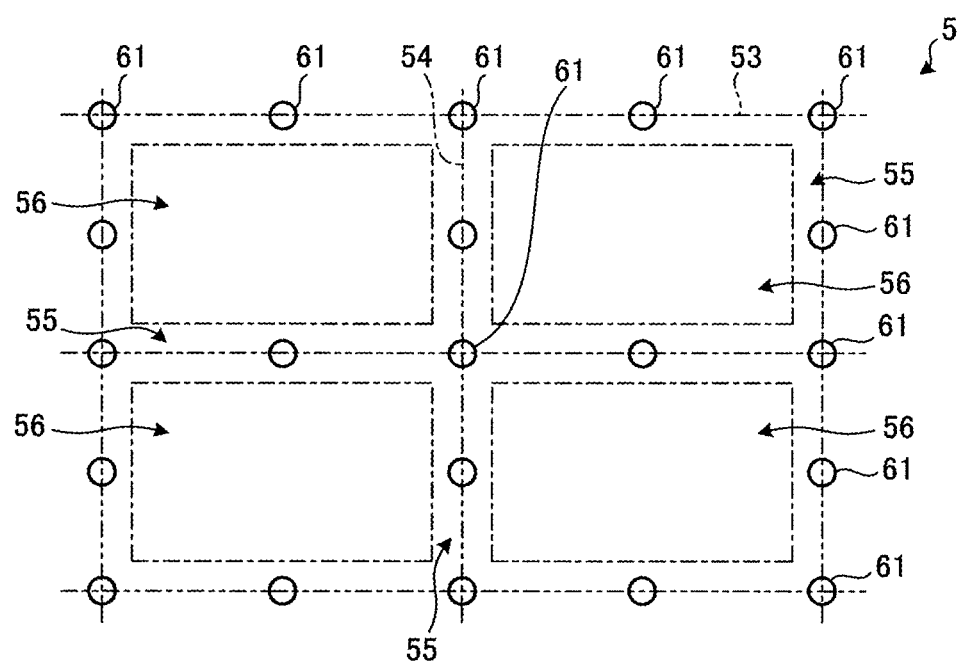
FIG. 8 is an enlarged plan view of a mother multilayer body according to the second embodiment.

FIG. 8 is an enlarged plan view of the mother multilayer body. Note that, in FIG. 8, the mother multilayer body 5 before pressing is illustrated after the plurality of ceramic green sheets 51 and the plurality of shrinkage suppressing green sheets 52 are laminated. As illustrated in FIG. 8, each of the plurality of hole portions 61 has a circular shape in a plan view, and the plurality of hole portions 61 is arrayed along the division planned lines 53 and 54. More specifically, the plurality of hole portions 61 are provided at positions overlapping with intersections of the division planned lines 53 and the division planned lines 54. The plurality of hole portions 61 is also provided at positions overlapping with the division planned line 53 or 54 between the intersections.

Next, as illustrated in FIG. 7, the pressing jig 8 forms the recessed portions 20 in the mother multilayer body 5 by pressing the recessed portion formation planned regions 56 of the mother multilayer body 5 (step ST12). The plurality of ceramic green sheets 51 and the plurality of shrinkage suppressing green sheets 52 deform along the shapes of the protruding portions 84 due to the pressure applied from the protruding portions 84. That is, the ceramic green sheets 51 and the plurality of shrinkage suppressing green sheets 52 in the recessed portion formation planned region 56 are thinned, are pushed out in the directions indicated by the arrows A, and flow to the wall portion formation planned region 55 side. A thickness of the wall portion formation planned region 55 is larger than that of the recessed portion formation planned region 56, and a width of the hole portion 61 becomes small due to the flow of the ceramic green sheets 51 and the plurality of shrinkage suppressing green sheets 52.

Further, when the upper mold 81 performs pressing, the mother multilayer body 5 deforms so as to cover lower surfaces and side surfaces of the protruding portions 84, and the wall portion formation planned region 55 is in contact with the lower surface 83*a* of the base 83. As a result, the shapes of the protruding portions 84 are transferred to the mother multilayer body 5. Further, an inner wall of the hole portion 61 is brought into close contact due to the flow of the plurality of ceramic green sheets 51 and the plurality of shrinkage suppressing green sheets 52 in the recessed portion formation planned region 56, and the mother multilayer body 5 is integrally formed on the division planned line 54.

Then, the mother multilayer body 5 having the recessed portions 20 can be obtained by removing the pressing jig 8 (step ST13).

Next, the mother multilayer body 5 is fired at a predetermined temperature (step ST14). As a result, the plurality of ceramic green sheets 51 and the plurality of shrinkage suppressing green sheets 52 are sintered together to obtain the fired mother multilayer body 9.

According to the method for manufacturing the ceramic substrate 1 of the second embodiment, since the hole portions 61 are provided in the mother multilayer body 5, the fluidity of the plurality of ceramic green sheets 51 and the plurality of shrinkage suppressing green sheets 52 in the press process can be improved. That is, when pressure is applied to the plurality of ceramic green sheets 51 and the plurality of shrinkage suppressing green sheets 52 by the pressing jig 8, the plurality of ceramic green sheets 51 and the plurality of shrinkage suppressing green sheets 52 in the recessed portion formation planned region 56 easily flow toward the wall portion formation planned region 55 side by the hole portions 61.

As a result, in the second embodiment, compared with the first embodiment, the distribution of the pressure to the plurality of ceramic green sheets 51 and the plurality of shrinkage suppressing green sheets 52 in the press process is relaxed, and the recessed portion 20 can be formed by deforming the recessed portion formation planned region 56 and the wall portion formation planned region 55 at a low pressure. Alternatively, it is possible to form a deep recessed portion 20 at the same pressure, compared to a case where the hole portions 61 are not formed.

Thus, in the mother multilayer body 5 after the press process, it is possible to suppress a difference in density of the plurality of ceramic green sheets 51 and the plurality of shrinkage suppressing green sheets 52 between the recessed portion formation planned region 56 and the wall portion formation planned region 55. As a result, it is possible to suppress the warpage of the ceramic substrate 1 formed after the firing and division of the mother multilayer body 5.

In addition, as illustrated in FIG. 8, the plurality of hole portions 61 are provided so as to surround the periphery of the recessed portion formation planned region 56. More preferably, the plurality of hole portions 61 are provided at positions symmetrical to each other with each recessed portion formation planned region 56 sandwiched therebetween. This makes it easier for the plurality of ceramic green sheets 51 and the plurality of shrinkage suppressing green sheets 52 in the recessed portion formation planned region 56 to flow uniformly toward the surrounding wall portion formation planned region 55 side, when pressing is performed by the pressing jig 8.

The configurations of the first embodiment and the second embodiment described above may be appropriately changed. For example, in FIG. 3, the plurality of ceramic green sheets 51 and the plurality of shrinkage suppressing green sheets 52 are laminated two by two, but the present invention is not limited thereto. The mother multilayer body 5 only needs to include at least one shrinkage suppressing green sheet 52. In addition, the number of the shrinkage suppressing green sheets 52 may be equal to or larger than three. Further, the number of ceramic green sheets 51 may also be one or be equal to or larger than three.

Further, the plurality of ceramic green sheets 51 and the plurality of shrinkage suppressing green sheets 52 may have different thicknesses. Further, the total number of the plurality of ceramic green sheets 51 and the plurality of shrinkage suppressing green sheets 52 configuring the mother multilayer body 5 is not limited to four, may be equal to or larger than five, and may be equal to or smaller than three.

Further, a cross-sectional shape of the recessed portion 20 has a partial shape of a rectangular shape having corner portions, but is not limited thereto. A connection portion between the inner wall surface 12*b* of the recessed portion 20 and the mounting surface 10*a* may be formed to have a curved surface that is curved. Alternatively, the mounting surface 10*a* of the recessed portion 20 may be formed to have a curved surface.

The number, arrangement, and shape in a plan view of the hole portions 61 can be changed as appropriate. For example, in FIG. 8, two or more hole portions 61 may be arrayed between the adjacent intersections. Alternatively, the hole portions 61 may be provided only at positions overlapping with the intersections, and the hole portions 61 may not necessarily be arrayed between the adjacent intersections. The shape of the hole portion 61 in a plan view is not limited to a circular shape, and may be other shapes, such as a rectangular shape, a rhombic shape, a cross shape, or a polygonal shape. Further, the plurality of hole portions 61 is not limited to being provided so as to penetrate from the upper surface to the lower surface of the mother multilayer body 5, and may be provided from the upper surface of the mother multilayer body 5 to the ceramic green sheet 51 of an intermediate layer.

Further, the electronic component 200 illustrated in FIG. 1 and FIG. 2 is not limited to the crystal unit, and may be another electronic component.

Note that the above-described embodiments are intended to facilitate understanding of the present invention, and are not intended to limit the present invention. The present invention can be modified/improved without departing from the gist thereof, and the present invention also includes equivalents thereof.

REFERENCE SIGNS LIST

1 CERAMIC SUBSTRATE
2 LID

3 METALLIZED LAYER
5 MOTHER MULTILAYER BODY
8 PRESSING JIG
9 MOTHER MULTILAYER BODY AFTER FIRING
10 SUBSTRATE BOTTOM PORTION
10a MOUNTING SURFACE
12 WALL PORTION
12a UPPER SURFACE
12b INNER WALL SURFACE
14 PEDESTAL
16 SUPPORTING PORTION
18 JOINING MEMBER
20 RECESSED PORTION
22 CONNECTION ELECTRODE
23 VIA
24, 25 BOTTOM ELECTRODE
51 CERAMIC GREEN SHEET
52 SHRINKAGE SUPPRESSING GREEN SHEET
53, 54 DIVISION PLANNED LINE
55 WALL PORTION FORMATION PLANNED REGION
56 RECESSED PORTION FORMATION PLANNED REGION
58 GRAIN BOUNDARY
61 HOLE PORTION
66 PLATE-SHAPED CERAMIC FILLING MEMBER
67 RESIN MATERIAL
81 UPPER MOLD
82 LOWER MOLD
83 BASE
84 PROTRUDING PORTION
91 CERAMIC LAYER
92 SHRINKAGE SUPPRESSING LAYER
100 PACKAGE
200 ELECTRONIC COMPONENT
A ARROW

The invention claimed is:

1. A ceramic substrate comprising: a substrate comprising a ceramic layer laminated on a shrinkage suppressing layer, the substrate having a bottom portion with a mounting surface on the ceramic layer, the shrinkage suppressing layer being located on a lower surface of the ceramic layer opposite the mounting surface and having a smaller planar shrinkage rate in firing than a planar shrinkage rate in firing of the ceramic layer, and where the ceramic layer and the shrinkage suppressing layer are co-sintered layers; and a wall portion on the bottom portion of the substrate and surrounding the mounting surface, wherein the wall portion includes at least the ceramic layer, and an orientation of a grain boundary indicating an interlayer between the ceramic layer and the shrinkage suppressing layer is curved along the mounting surface and an inner wall of the wall portion.

2. The ceramic substrate according to claim 1, wherein the shrinkage suppressing green sheet includes a plate-shaped ceramic filling member.

3. The ceramic substrate according to claim 2, wherein the plate-shaped ceramic filling member is alumina.

4. The ceramic substrate according to claim 2, wherein a maximum length dimension of the plate-shaped ceramic filling member of the shrinkage suppressing green sheet is equal to or more than twice a maximum length dimension of a ceramic powder that is a main component of the shrinkage suppressing green sheet.

5. The ceramic substrate according to claim 1, wherein both the shrinkage suppressing green sheet and the ceramic green sheet include a plate-shaped ceramic filling member.

6. The ceramic substrate according to claim 5, wherein the plate-shaped ceramic filling member is alumina.

7. A ceramic substrate comprising: a substrate comprising a ceramic layer laminated on a shrinkage suppressing layer, the substrate having a bottom portion with a mounting surface on the ceramic layer, the shrinkage suppressing layer being located on a lower surface of the ceramic layer opposite the mounting surface and having a higher content rate of a plate-shaped ceramic filling member than a content rate of the plate-shaped ceramic filling member in the ceramic layer, and where the ceramic layer and the shrinkage suppressing layer are co-sintered layers; and a wall portion on the bottom portion of the substrate and surrounding the mounting surface, wherein the wall portion includes at least the ceramic layer, and an orientation of a grain boundary indicating an interlayer between the ceramic layer and the shrinkage suppressing layer is curved along the mounting surface and an inner wall of the wall portion.

8. The ceramic substrate according to claim 7, wherein the plate-shaped ceramic filling member is alumina.

9. The ceramic substrate according to claim 7, wherein a maximum length dimension of the plate-shaped ceramic filling member of the shrinkage suppressing green sheet is equal to or more than twice a maximum length dimension of a ceramic powder that is a main component of the shrinkage suppressing green sheet.

* * * * *